(12) United States Patent
Aratani et al.

(10) Patent No.: US 7,633,094 B2
(45) Date of Patent: Dec. 15, 2009

(54) ELECTROLUMINESCENCE DISPLAY PANEL, IMAGE DISPLAY, AND METHOD FOR MANUFACTURING THEM

(75) Inventors: Sukekazu Aratani, Hitachiota (JP); Yoshiyuki Kaneko, Hachioji (JP); Makoto Tsumura, Hitachi (JP)

(73) Assignee: Hitachi, Ltd., Chiyoda-Ku (JP)

( * ) Notice: Subject to any disclaimer, the term of this patent is extended or adjusted under 35 U.S.C. 154(b) by 278 days.

(21) Appl. No.: 10/474,829

(22) PCT Filed: Apr. 19, 2001

(86) PCT No.: PCT/JP01/03353

§ 371 (c)(1), (2), (4) Date: Mar. 11, 2004

(87) PCT Pub. No.: WO02/087287

PCT Pub. Date: Oct. 31, 2002

(65) Prior Publication Data

US 2004/0137658 A1   Jul. 15, 2004

(51) Int. Cl.
*H01L 27/15* (2006.01)
(52) U.S. Cl. .......... 257/82; 257/E33.001; 257/E31.096; 313/498; 445/24
(58) Field of Classification Search .......... 257/40, 257/79, 82, 13, 918, E31.096, E33.001; 438/30, 438/99, 47, 69; 313/498; 445/24
See application file for complete search history.

(56) References Cited

U.S. PATENT DOCUMENTS 5,726,457 A * 3/1998 Nakano et al. ................. 257/40
6,215,250 B1 * 4/2001 Hirano et al. ............. 315/169.3
6,284,307 B1   9/2001 Fukuzawa et al.
6,366,016 B1   4/2002 Sakaguchi et al.
6,380,673 B1   4/2002 Sekiya et al.

(Continued)

FOREIGN PATENT DOCUMENTS

JP         08-124679         5/1996

(Continued)

OTHER PUBLICATIONS

Chang, et al., "Dual-color Polymer Light-Emitting Pixels Processed by Hybrid Inkjet Printing" Dept. of Materials Science and Engineering, University of California-Los Angeles, p. 147-150, Nov. 2, 1998.

(Continued)

*Primary Examiner*—Quoc D Hoang
(74) *Attorney, Agent, or Firm*—Hogan & Hartson LLP (57) ABSTRACT

The present invention provides the following methods and displays. A method for manufacturing an EL display panel, having the step of forming a light-emitting layer by irradiating light on a photothermal conversion layer through a transparent base member while a dye layer of a transfer member having the transparent base member, the photothermal conversion layer and this fluorescent dye layer is kept in close contact with an object to which the dye is to be transferred, the transparent base member, the photothermal conversion layer and the transfer member being laminated in this order, so that the dye can be transferred to the object. An EL display panel produced according to this method, an image display having this panel, and a method for manufacturing the image display.

4 Claims, 14 Drawing Sheets

U.S. PATENT DOCUMENTS

| | | |
|---|---|---|
| 6,614,176 B2 * | 9/2003 | Kim et al. .................. 313/506 |
| 6,656,519 B2 | 12/2003 | Sakaguchi et al. |
| 6,712,661 B1 | 3/2004 | Kiguchi et al. |
| 2002/0027414 A1 | 3/2002 | Sekiya et al. |
| 2002/0090449 A1 | 7/2002 | Sakaguchi et al. |

FOREIGN PATENT DOCUMENTS

| | | | |
|---|---|---|---|
| JP | 11-087062 | | 3/1999 |
| JP | 11-087063 | | 3/1999 |
| JP | 11087062 | * | 3/1999 |
| JP | 2000-012216 | | 1/2000 |
| JP | 2000-058270 | | 2/2000 |
| JP | 2000-208254 | | 7/2000 |
| WO | 0018193 A1 | | 3/2000 |

OTHER PUBLICATIONS

Miyaguchi, et al., "Organic LED Full-Color Passive-Matrix Display" p. 137; Extended Abstracts: the Fourth International Conference on the Science and Technology of Display Phosphors: $9^{th}$ International Workshop on Inorganic and Organic Electroluminescence, Sep. 14-17, 1998.

Wu, et al., "Finite-Source Dye-Diffusion Thermal Transfer for Doping and Color Integration in Organic Light-Emitting Diodes and Displays" Dept. of Electrical Engineering and Graduate Institute of Electro-optical Engineering, National Taiwan University, SID 00 Digest 1080-1083 , May 2000.

Japanese language office action and its English language translation for corresponding Japanese application 2002584661.

* cited by examiner

ELECTROLUMINESCENCE DISPLAY PANEL, IMAGE DISPLAY, AND METHOD FOR MANUFACTURING THEM

TECHNICAL FIELD

The present invention relates to organic electroluminescence (EL) elements, an image display and a method for manufacturing them.

BACKGROUND ART

The three primary colors, RGB (Red, Green and Blue) of an image display using organic EL elements have been produced by a method of evaporating color materials through a metal mask (hereafter, called the mask evaporation method) as described in "9$^{th}$ International workshop on Inorganic and organic electroluminescence, p. 137 (1998)" or by a method of applying the ink jet printing (hereafter, called the ink jet method) as described in "Extended Abstract of EL98, 147 (1998)". However, it is difficult to produce large-area and high-resolution screens for future demand by these conventional methods.

For example, in the mask evaporation method it is hard to make a thin mask of several tens of μm in close contact with a large substrate without wrinkle or folds and to remove the effect of thermal expansion in the evaporation of metal electrodes. Therefore, it is difficult to realize large area, high-resolution screens. In addition, the ink jet method is inappropriate for printing sufficiently wide and high-resolution light-emitting regions because of its low deposition-positioning precision.

Thus, as a method capable of solving these problems, there has been proposed a method of transferring dye materials onto a substrate so that the transfer layer and the transferred layer can be kept in close contact with each other without use of liquid solution. In this method, as described in "Society of Information Display '00, p. 1080 (2000)", a pattern of three primaries RGB is formed by screen-printing on a transfer substrate from which the dye materials are to be transferred, and the three-primary materials are thermally transferred to the transferred substrate at a time.

In this transfer technique, however, a dye pattern is formed by the screen printing method using a solution, and thus it is difficult to produce a large-area and high-resolution pattern that is to be transferred. In addition, since three-color dye materials are transferred at a time, a long transfer time of tens of minutes must be taken in order for the transfer speeds of the color materials to be adjusted.

DISCLOSURE OF THE INVENTION

It is an object of the invention to provide a large-area and high-resolution EL device, an image display having this device, and a method for manufacturing them.

According to this invention, in order to achieve this object, there is provided a method for manufacturing an EL display panel, this method having steps in which light is irradiated on a photothermal conversion layer through a transparent base member while a fluorescent dye layer of a transfer member that has the transparent base member, the photothermal conversion layer (a layer that absorbs light and generates heat) and this dye layer stacked n this order is kept in close contact with the body to which the dye is to be transferred so that the fluorescent dye can be transferred to the body, thus forming the light-emitting layer.

The transparent base member may be anything, for example, a glass plate as long as irradiation light for transfer can be transmitted through it. In addition, the irradiation light used here is desired to be laser beam that can be irradiated only on a necessary portion (namely, an area in which the pixels are built up). It is also desired possible that only the necessary region is exposed to light by irradiating light through a photomask.

According to the invention, since only the dye in the exposed region is transferred, the dye pattern of materials to be transferred is not necessarily formed at a strictly precise location. Therefore, this invention is effective to produce a high-resolution and large-area display panel.

Moreover, according to the invention, the three primaries RGB can be separately transferred, and thus it is not necessary to adjust the transfer speeds of the light-emitting materials. Also, since the three different color dyes can be transferred from different base members in addition to the merit that the light-emitting layer can be formed by transfer, the number of manufacturing processes can be reduced by one as compared with the conventional method in which the three color dyes are transferred at a time.

In this invention, the photothermal conversion layer for absorbing light and generating heat is provided in the transfer member as a foundation layer for the fluorescent dyes. Therefore, according to the invention, since the irradiated light can be converted into heat with good efficiency, the dyes can be transferred in a short time.

In addition, according to the invention, there is provided a method for manufacturing an EL display panel, this method having the steps of producing a first electrode on a substrate, producing a partition wall on the electrode, producing a first charge transport layer on the electrode, and transferring the fluorescent dyes on the surface of the charge transport layer, the height of the top of the partition wall formed by the step of producing the partition wall being lower than that of the top of the light-emitting layer. In this specification, except as otherwise noted, the lamination direction of the panel is assumed to be vertical, and the substrate side to be bottom. In addition, the heights of the tops of the partition wall and charge-transport layer are assumed to measure from the substrate.

Moreover, according to this invention, there is provided an EL display panel having a substrate, and a first electrode, a plurality of light-emitting portions that emit light when excited by voltage application, a second electrode, and a partition wall for separating the adjacent light-emitting portions which are laminated on the substrate in this order, the light-emitting portions having at least a first charge transport layer and a light-emitting layer laminated in this order from the substrate side, and the height of the top of the partition wall being lower than that of the top of the light-emitting layer.

Since the height of the top of the partition wall is kept lower than that of the first charge transport layer, the light-emitting regions matched with the size of the light-emitting portions can be produced without the effect of the beam diameter of the irradiation light when each dye is transferred to necessary locations by light irradiation. The top of the partition wall is desirably water-repellent. For example, a fluorine compound, when included, can provide high water-repellency. Here, the water-repellency means that the contact angle to the solution for producing the charge transport layer is higher than 50°.

The light-emitting layer in this invention is desirably the diffusion layer of fluorescent dye formed on the second electrode side of the first charge-transport layer. Here, the diffusion layer is the layer formed by diffusing fluorescent dye into the charge transport substance that constitutes the first charge-transport layer. The dye content can be properly determined according to need, but defined to be, for example, 0.1 weight % or more contained in the upper portion of the first charge transport layer.

Moreover, since the light-emitting efficiency is raised by increasing the charge confining effect, it is desirable to provide a second charge-transport layer between the light-emitting layer and the second electrode.

In addition, according to the invention, there is provided an EL display panel having a substrate, and a first electrode, a plurality of light-emitting portions that emit light when excited by voltage application, a second electrode, and a partition wall for separating the adjacent light-emitting portions which are laminated on this substrate in this order, the top end of the side of the partition wall made in contact with the light-emitting portions being covered by at least any layer of the light-emitting portions and/or an insulating layer. Therefore, the cathodes can be prevented from short circuit.

In the EL display panels of the present invention, the top surface of the light-emitting portions is desirably a curved surface to be convex toward the second electrode. By forming the light-emitting portions in such a shape, it is possible to increase the light-emitting efficiency.

Also, according to the invention, there are provided an image display having the above EL display panel of the invention, and a method for manufacturing it.

BEST MODE FOR CARRYING OUT THE INVENTION

Embodiments of the invention will be described with reference to the drawings. However, this invention is not limited to these embodiments. In addition, in the following embodiments, the present invention is applied to the organic EL device having the light-emitting layers of three colors RGB, but is not limited to the device. For example, the invention can be applied to a device having a hole blocking layer or a device having a green-light emission layer/electron transporting layer, a red-light emission layer and a blue-light emission layer.

Embodiment 1

A. Construction of Pixel

Figure 2:
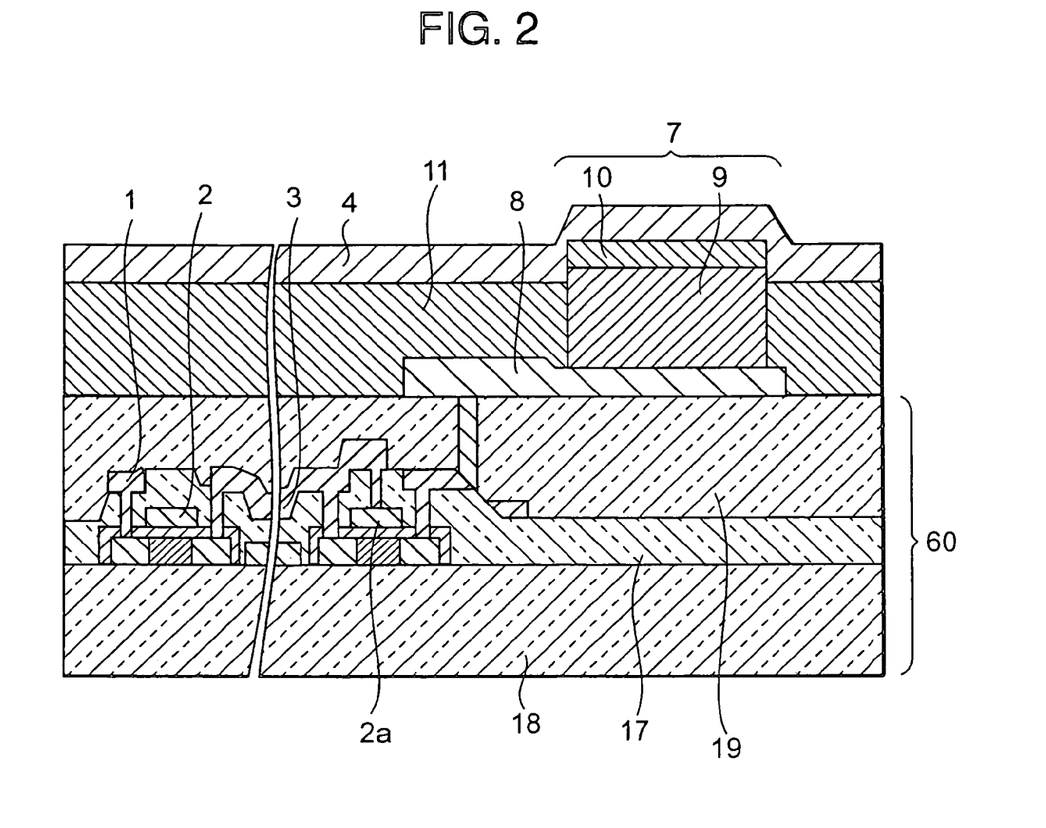
FIG. 2 is a cross-sectional diagram taken along a line A-A' in the image display of the embodiment shown in FIG. 1.

The pixels of the display panel of the image display produced in this embodiment have, as shown in FIG. 2, a wiring substrate 60, organic EL elements 7 and a partition wall 11 formed on the surface of the substrate. The wiring substrate has a glass substrate 18, electrode/wiring lines 1~3, 2a, and interlaminar insulating layers 17, 19.

Figure 1:
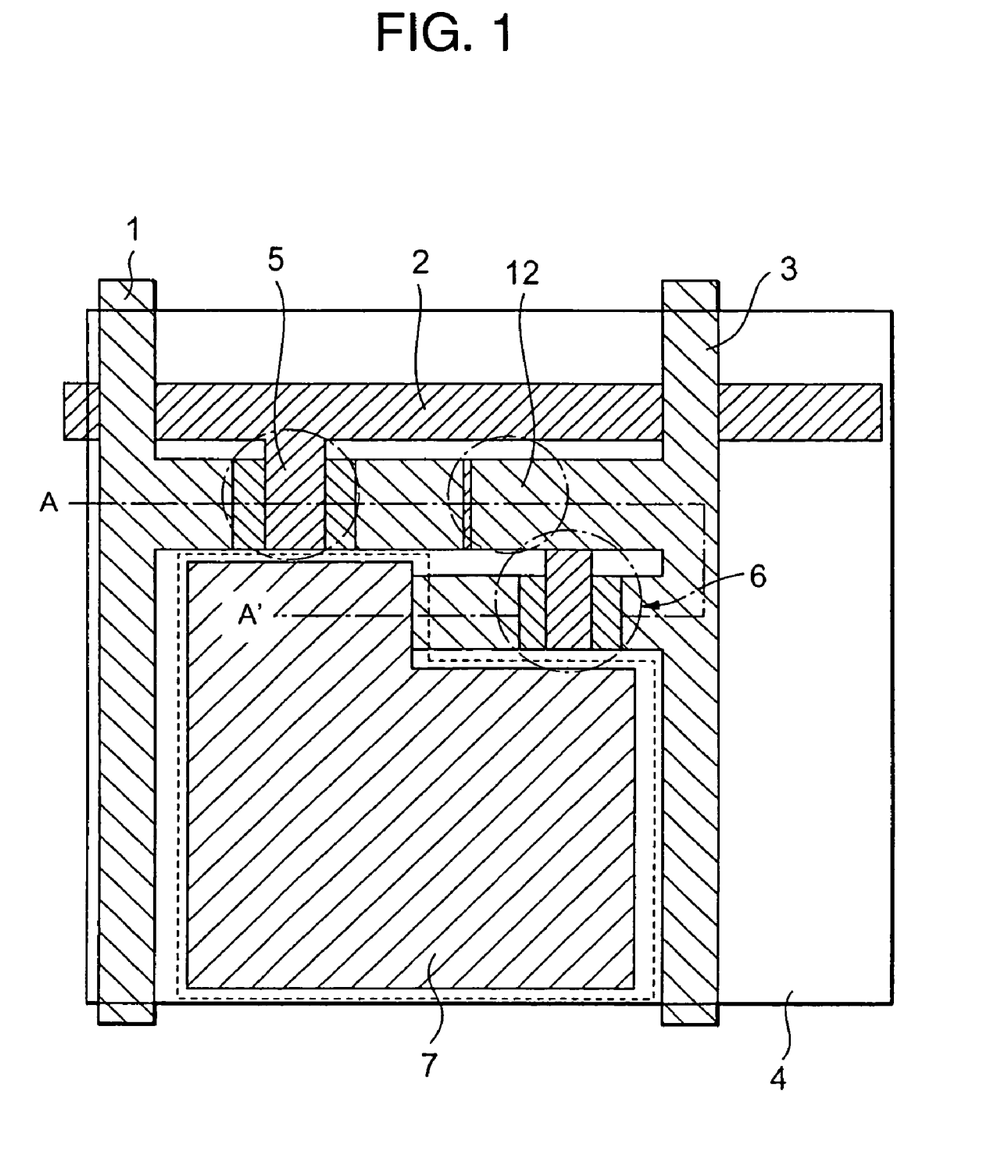
FIG. 1 is a pattern diagram of a pixel of the image display in the embodiment 1.

FIG. 1 is the top view of this pixel. For easy viewing, we omitted the illustration of the insulating layers in FIG. 1. FIG. 2 is a cross-sectional view taken along the line A-A' in FIG. 1. As illustrated in FIG. 1, the video signal electrode 1, scanning signal electrode 2, common potential electrode 3 and current supplying electrode 4 frame an active matrix. In addition, a switching transistor 5, a driving transistor 6 and a capacitor 12 are provided for energizing the organic EL element 7 in each matrix element.

The organic EL element 7, as shown in FIG. 2, has an anode 8 connected to the driving transistor 6, a charge-transport layer 9, a light-emitting layer 10, and a cathode. The cathode corresponds to the current supplying electrode 4. The top of the charge-transport layer 9 is higher than that of the partition wall 11.

Figure 3:
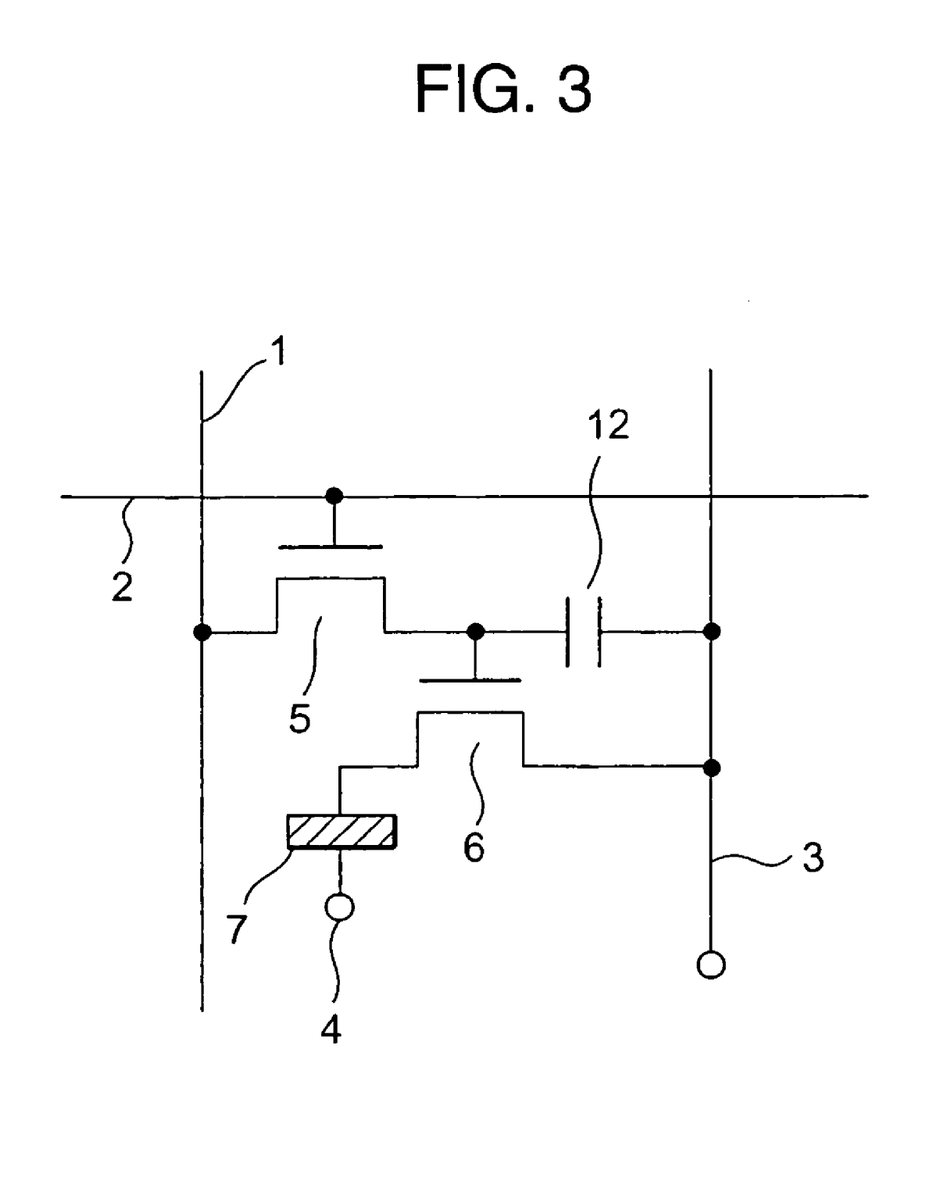
FIG. 3 is a circuit diagram of the pixel of the image display in the embodiment 1.

FIG. 3 is a circuit arrangement of one pixel of the image display in this embodiment. As illustrated, the switching transistor 5 is turned on when a scanning signal is applied to the scanning signal electrode 2, and as a result, the potential of the video signal electrode 1 is stored in the capacitor 12 and transmitted to the driving transistor 6. This potential determines the voltage to be applied to the organic EL element 7. The light-emitting layer 10 is energized to emit light by the currents flowing from the common potential electrode 3 and current supplying line 4 due to the potential. The image display of this embodiment utilizes the light emission from this light-emitting layer 10 to display images.

Figure 4:
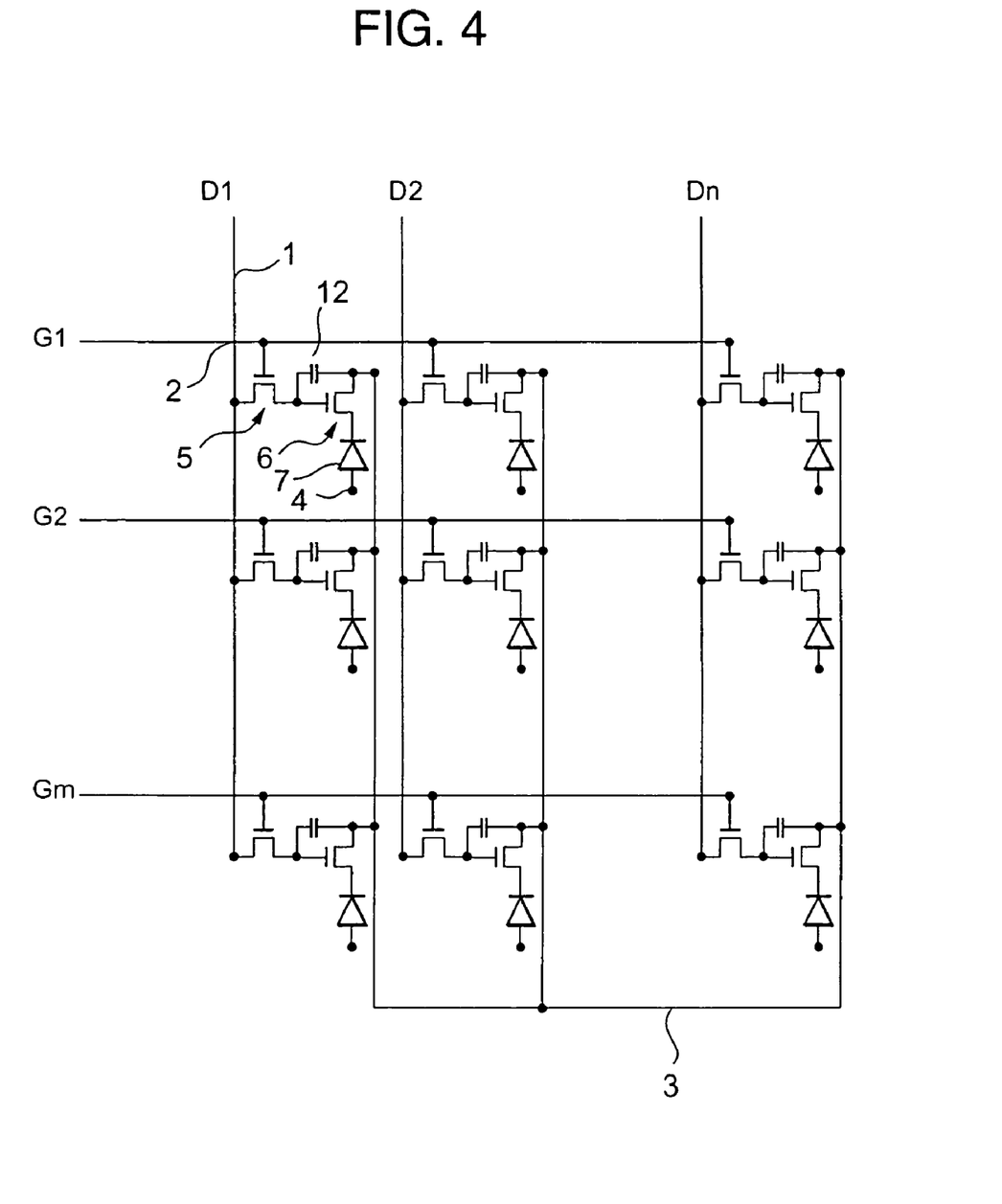
FIG. 4 is a circuit diagram of the whole display portion of the image display in the embodiment 1.

FIG. 4 is a circuit diagram of the whole display portion. The circuit arrangement of each pixel shown in FIG. 3 is connected as one element of the matrix to the n video signal electrodes 1 and n scanning signal electrodes 2, thus constituting the display.

Figure 5:
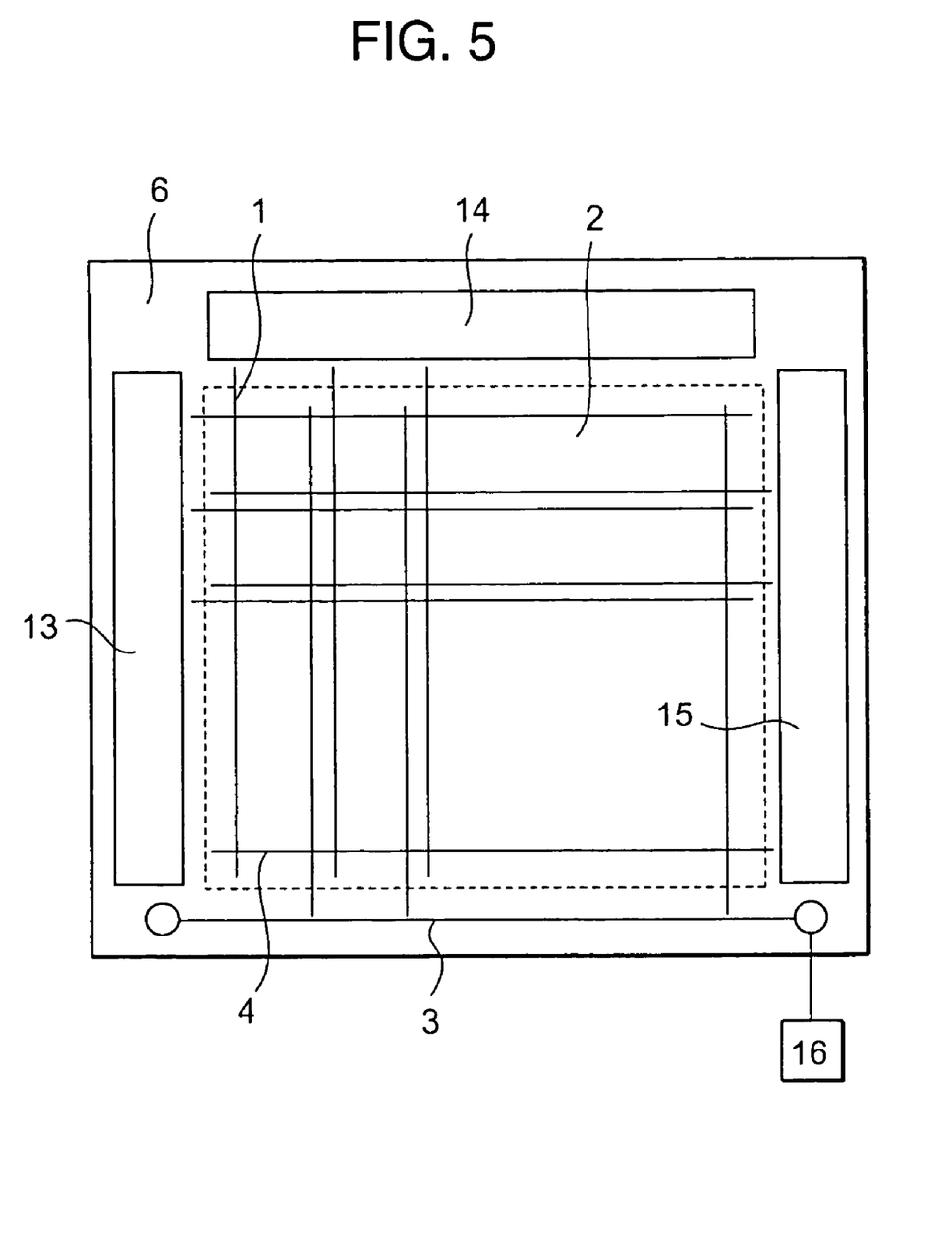
FIG. 5 is a circuit diagram of the whole image display in the embodiment 1.

FIG. 5 shows the whole circuit arrangement including driving circuits. The scanning signal is supplied from a scanning signal source 13 to the scanning signal electrodes 2. The video signal is supplied from a video signal source 14 to the video signal electrodes 1. The current from a current supplying source 15 is supplied to the current supplying electrode 4. The charges from a common potential supplying source 16 are supplied to the common potential electrodes 3. In addition, even a non-photosensitive material may be similarly used if it can be patterned by using a resist.

B. Manufacturing Process

The manufacturing process for the partition wall 11 and organic EL element 7 in this embodiment will be described below.

(1) Production of Lower Electrode and Partition Wall 11

Figure 6:
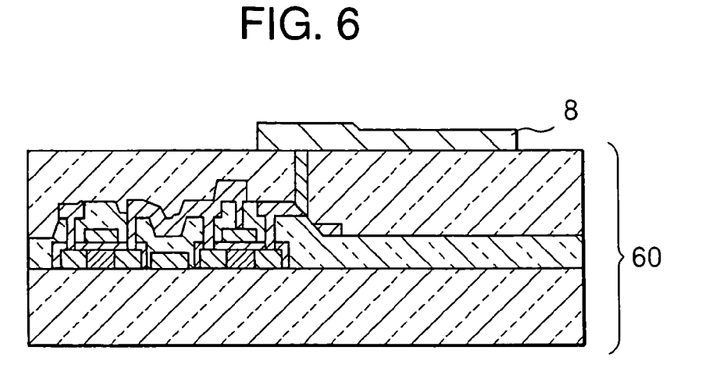
FIGS. 6~12 are process flow diagrams of a method for manufacturing the image display in the embodiment 1.
Figure 7:
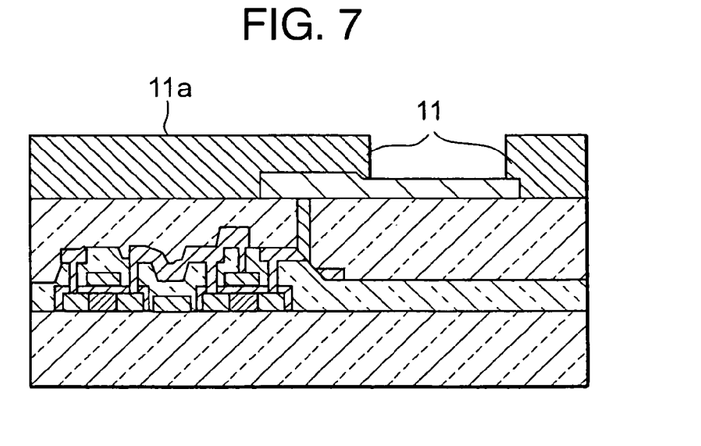

First, the anode 8 was formed on the surface of wiring substrate 60 (FIG. 6), and further the partition wall 11 of a predetermined pattern was formed over the anode (FIG. 7). This partition wall 11 can be formed by using the normal photolithography. The material for the partition wall 11 may be a photosensitive material such as acrylic- or polyimide-based material.

In addition, even a non-photosensitive material may be similarly used if it can be patterned by using a resist.

This partition wall material may be the conventionally used material. However, it is desirable to finish the top 11a of the partition wall to have water repellency, thus further suppressing the transfer to the partition wall 11, and making the peeling after transfer easy. In order to give this top 11a of partition wall the water repellency, it is necessary to, for example, make a plasma treatment using $CF_4$ gas. Moreover, the partition wall 11 may be formed by using a water-repellent material containing fluorine compound. Fluorine atoms to the surface of partition wall 11 can cause the top of the partition wall to exhibit high water repellency.

(2) Deposition of First Charge Transport Layer 9

Figure 8:
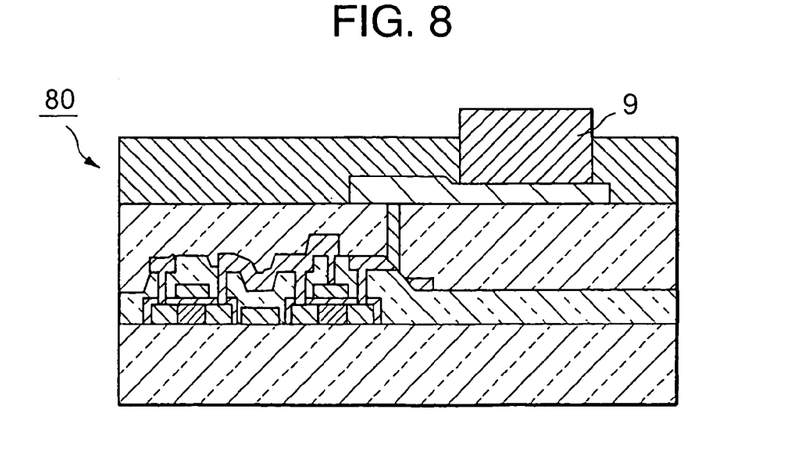

Then, the solution containing the charge transport material was coated on the anode 8, and dried to form the charge transport layer 9 (electron transport layer), thus completing the laminated body 80 (FIG. 8). In this embodiment, the charge transport material used here was a mixture of polyvinyl carbazole expressed by the following chemical formula (1) and Bu-PBD expressed by the following chemical formula (2), of which the mixture ratio is 3:1.

Other charge transport materials may be used; for example, a polymer having triphenylamine bone structure, a polymer having dispersed therein a low-molecular-based charge transport material such as triphenyldiamine, polyfluorene-based polymer as conjugated polymer that also functions as a light-emitting layer, polyparapolyphenylenevinylene-based polymer or copolymers of them.

This charge-transport layer 9 may be formed by coating the solution containing the charge transport material, and then removing the unnecessary charge transport material from the partition wall 11 by laser ablation or may be formed by the normal photolithography.

(3) Deposition of Light-Emitting Layer 10

Figure 9:
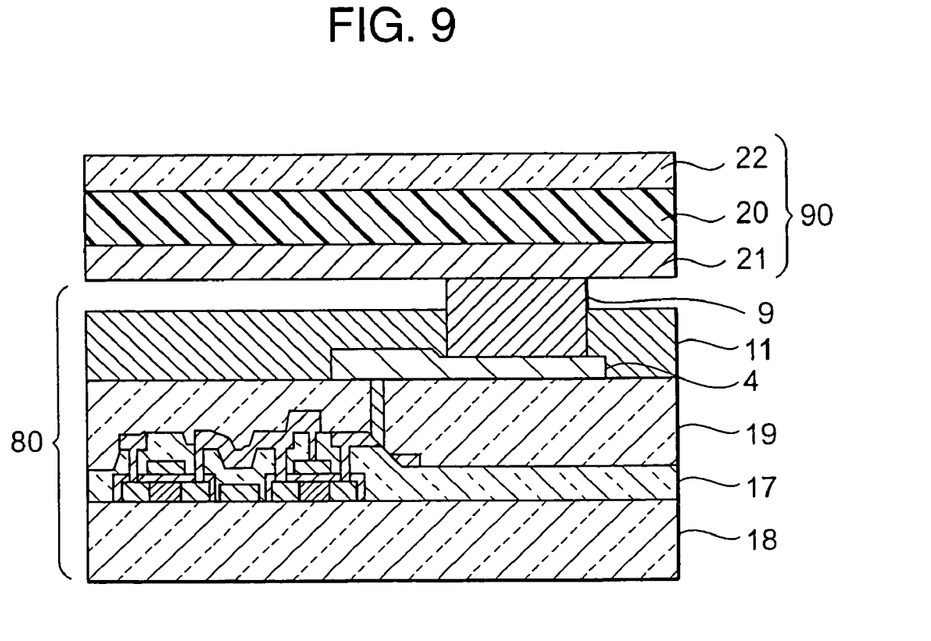
Figure 10:
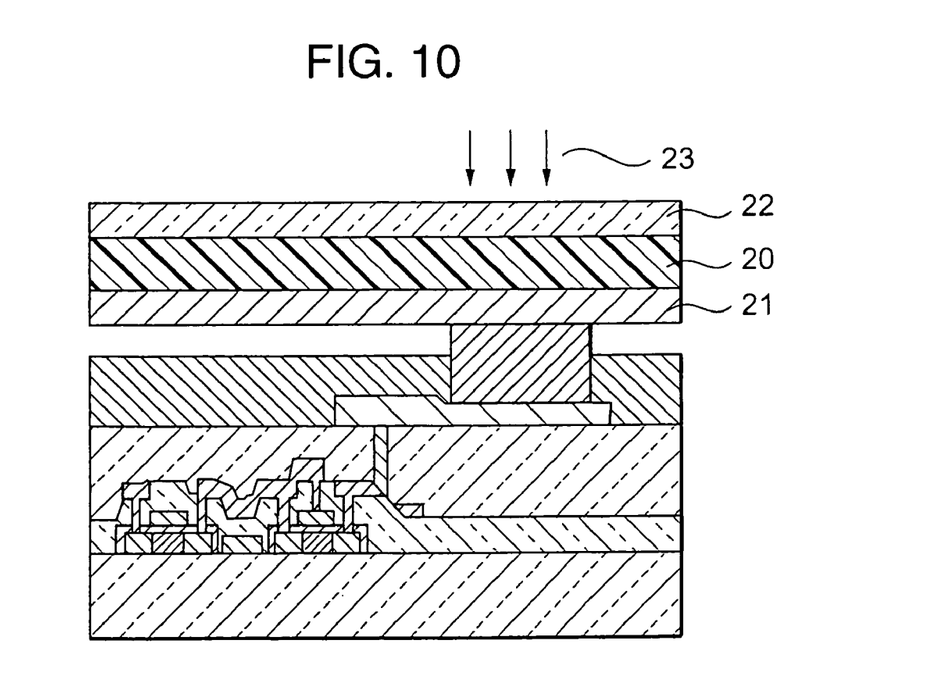

Subsequently, a photothermal conversion layer 20 and a dye layer 21 containing a blue dye were laminated on a transfer base (glass plate) 22, thus producing a transfer member (blue) 90. This transfer member 90 was pressed against the laminated body 80 so that the dye layer 21 could be made in contact with the top of the charge-transport layer 9 (FIG. 9). Then, laser light 23 was irradiated on a predetermined area (where the blue pixels are formed) (FIG. 10).

Figure 11:
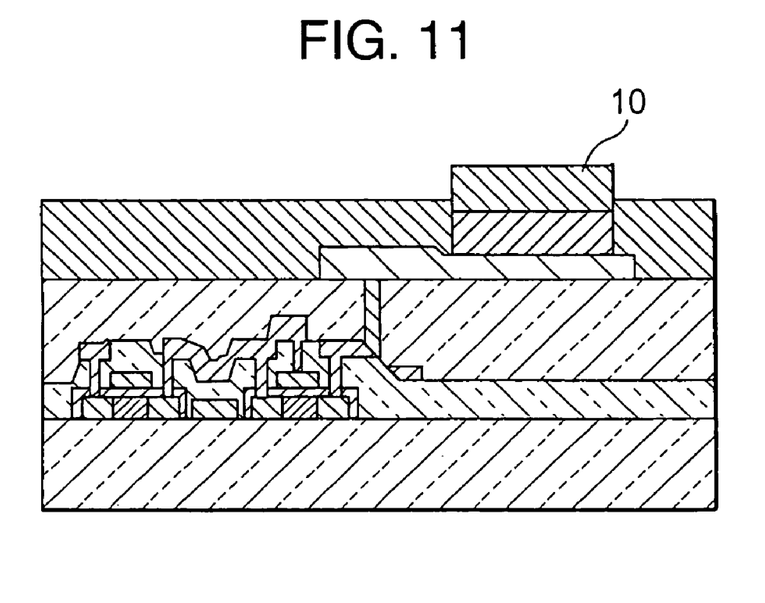

The heat generated from the exposed photothermal conversion layer 20 acts on the dye layer 21 so that the fluorescent dye contained in the dye layer 21 of the transfer member 90 that is made in contact with the charge transport layer 9 can be thermally diffused into the charge transport layer 9 to form the light-emitting layer 10 (blue light-emitting pattern) only on the top of the charge transport layer 9 (FIG. 11). In addition, since the dye is diffused only into the top of the charge transport layer 9 that is made in contact with the dye layer, a high-resolution light-emitting layer can be formed not depending on the shape of the laser beam.

In this embodiment, a polymer film containing chromium oxide was used for the photothermal conversion layer 20. Other photothermal conversion materials that can be used here may be organic black pigments such as perylene derivatives, metallic compounds such as TbFeCo, black alumina, and carbon black.

In addition, continuous-oscillation Nd:YAG laser was used for the laser beam. The laser scan speed was 128 m/sec. The output was 3W, and the beam diameter was 40 μm ($1/e^2$). The laser used here is not limited to the Nd:YAG laser, but may be a semiconductor laser or DPSS laser.

Then, this transfer process (FIGS. 9~11) was performed for each color of green and red to form the light-emitting layers 10 of RGB pixels that have three-color, RGB light-emitting patterns.

(4) Deposition of Upper Electrode

Figure 12:
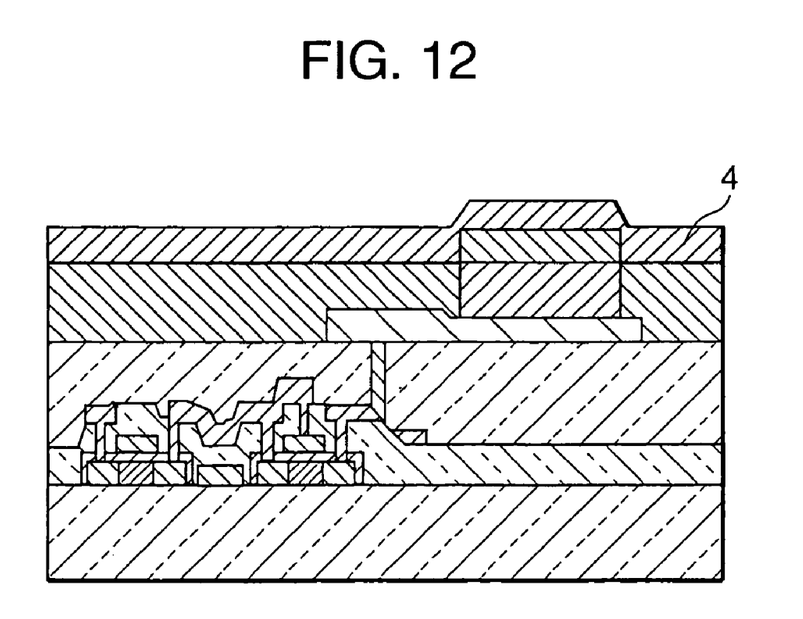

Subsequently, the power-supplying electrode (cathode) 4 was deposited over the substrate (FIG. 12). While Mg:Ag alloy was used for the cathode material in this embodiment, Al:Li alloy or LiF/Al lamination film may be used. In this embodiment, the RGB pixels having a pixel pitch of 0.127 mm×0.042 mm could be uniformly formed in a stripe shape.

(5) Assembly of Image Display

Thus, we produced the EL display panel having the organic EL elements. Finally, we normally assembled the image display by using this panel.

Embodiment 2

Figure 13:
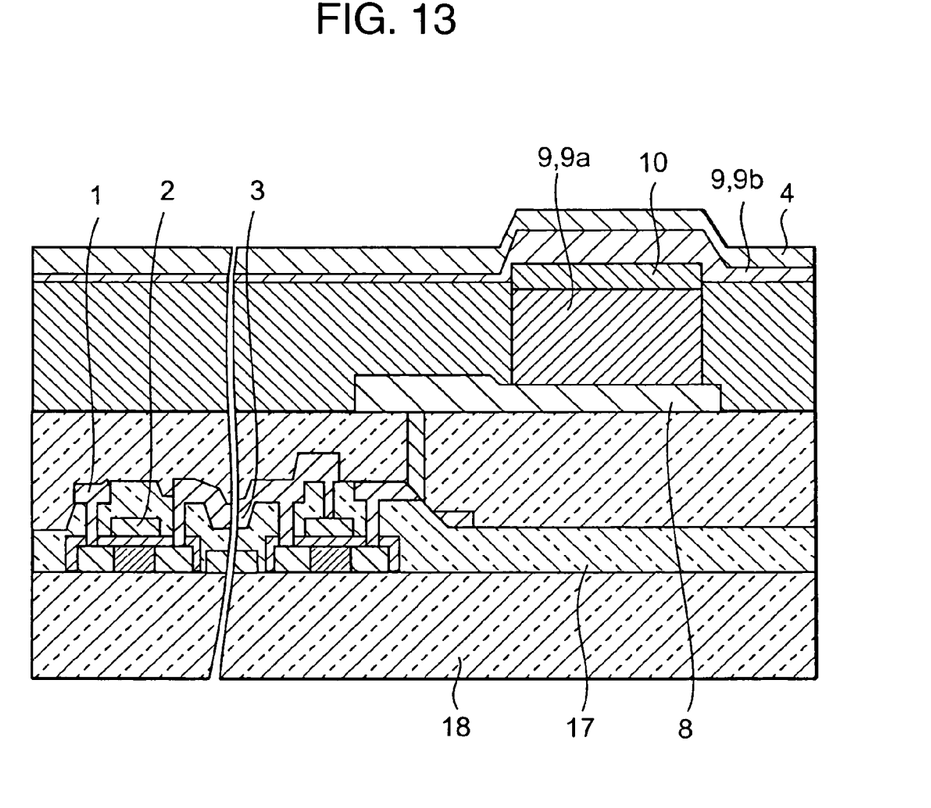
FIG. 13 is a partial cross-sectional diagram of a pixel of the image display in the embodiment 2.

FIG. 13 is a cross-sectional view of the pixel of the image-display produced in this embodiment. In this embodiment, although only a single charge-transport layer was provided in the embodiment 1, the second charge-transport layer 9 (, or electron layer 9b) containing the charge transport substance was provided by after the formation of light-emitting layer 10 but before the deposition of cathode 4.

The electron transporting layer 9b as the second charge-transport layer 9 acts to increase the charge confining effect in the image display of this embodiment, and thus making it possible to raise the light-emitting efficiency. Moreover, since the top of the interface between the partition wall 11 and the charge transport layer 9 can be covered by this second charge transport layer 9, it is possible to prevent the short circuit from occurring when the cathode 4 is deposited.

Embodiment 3

Figure 14:
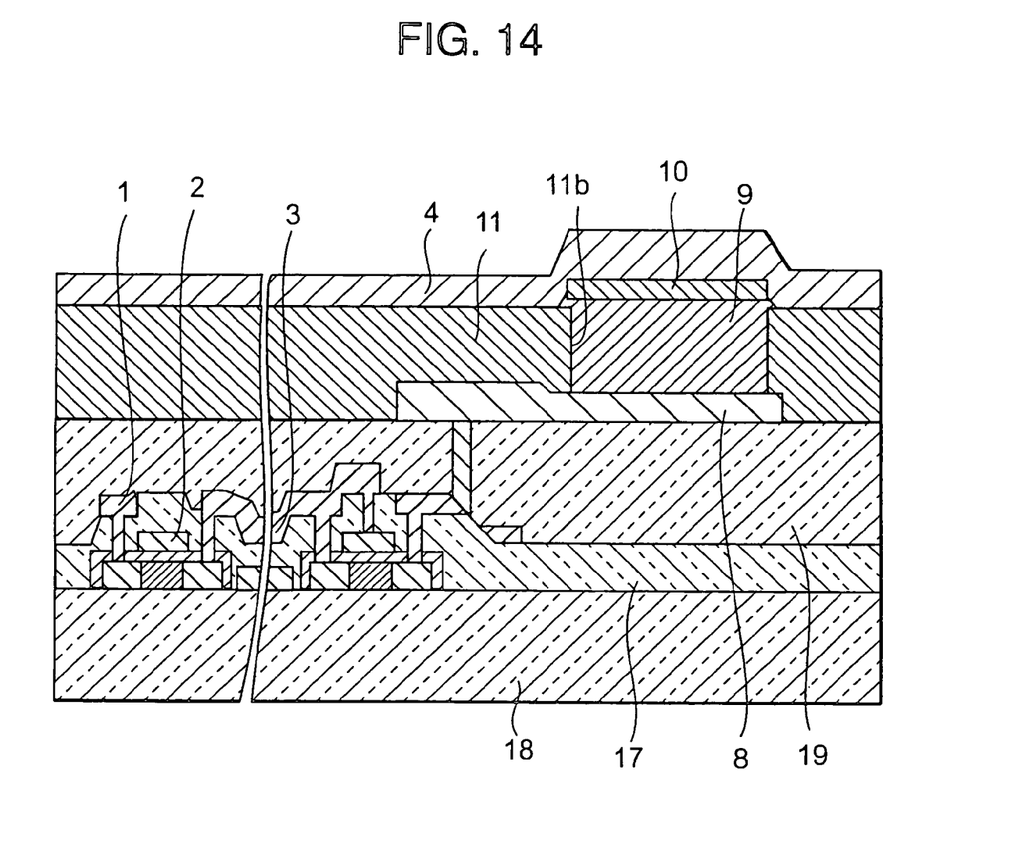
FIG. 14 is a partial cross-sectional diagram of a pixel of the image display in the embodiment 3.

FIG. 14 is a cross-sectional view of the pixel of the image display produced in this embodiment. In this embodiment, the image display was produced in the same way as in the embodiment 1. However, in the process (2) of embodiment 1, the charge-transport layer 9 was formed to cover the top of the side 11b of the partition wall 11. This structure can be built up by photolithography or laser abrasion.

The structure in which the top of the side of the partition wall 11 is covered by the charge-transport layer 9 is desirable because short circuit can be prevented from occurring after the cathode 4 is deposited.

Embodiment 4

Figure 15:
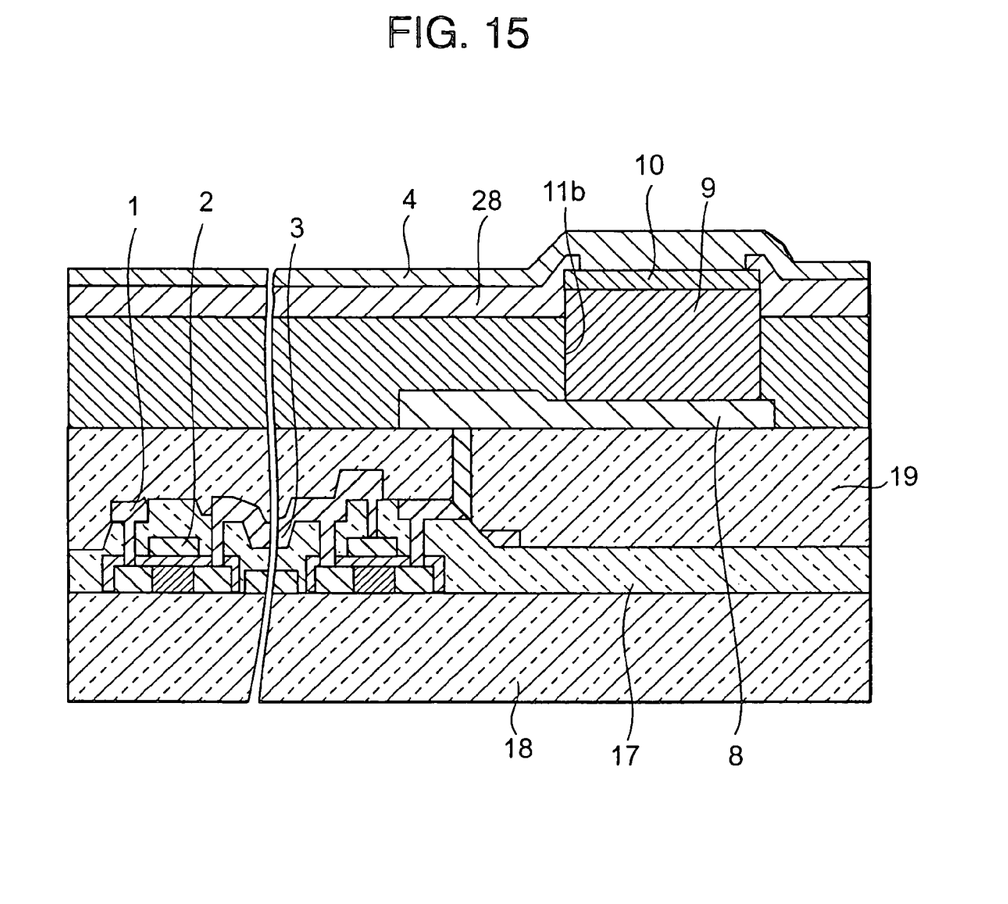
FIG. 15 is a partial cross-sectional diagram of a pixel of the image display in the embodiment 4.

FIG. 15 is a cross-sectional view of the pixel of the image display produced in this embodiment. In this embodiment, too, the image display was produced in the same way as in the embodiment 1. However, an insulating layer 28 was formed on the surfaces of the outer edges of the partition wall 11 and light-emitting layer 10, after the light-emitting layer 10 was formed but before the cathode 4 was deposited, so that it can cover the top of the side 11b of the partition wall 11. The structure of this embodiment is also such that the top of the side of the partition wall 11 is covered by the insulating layer 28, as is the structure of the embodiment 3. Thus, the short circuit can be prevented after the formation of the cathode 4. A buffer layer may be provided in place of the insulating layer 28.

Embodiment 5

Figure 16:
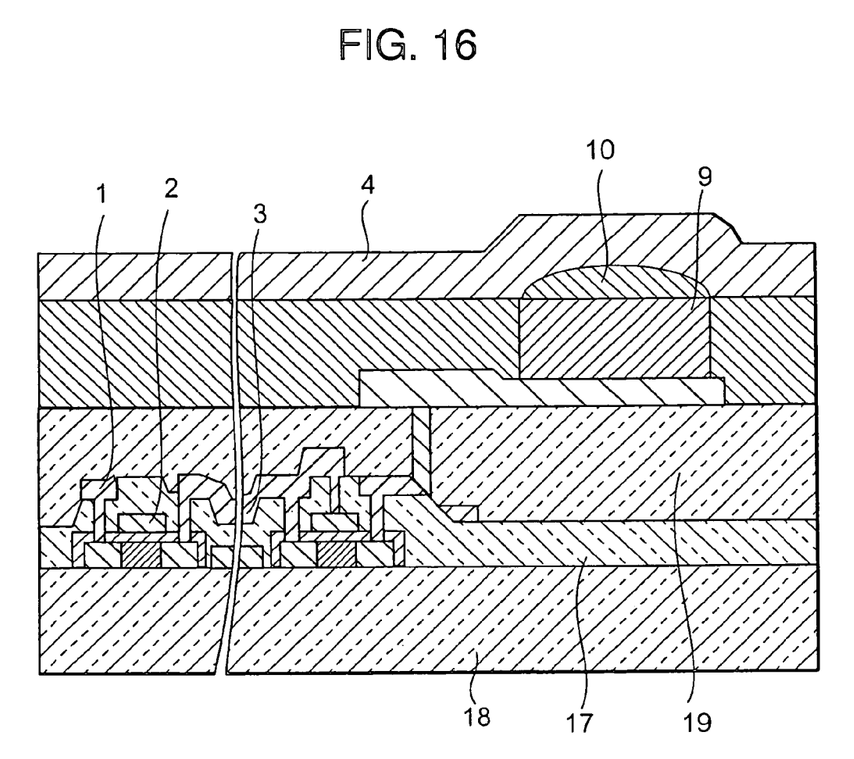
FIG. 16 is a partial cross-sectional diagram of a pixel of the image display in the embodiment 5.

In this embodiment, the image display was produced in the same way as in the embodiment 1 except that the top of the charge transport layer 9 formed in the process (2) was formed in a dome shape shown in FIG. 16, or the top was curved to be convex upward. This domed shape can be achieved by depositing the partition wall 11 with a water-repellent material and then coating the solution of charge transport material to form the charge-transport layer 9. The light-emitting efficiency of the display of this embodiment was about 10% higher than that of the embodiment 1.

The domed shape of the top of the charge-transport layer 9 can be realized by depositing a domed insulating layer under the anode 8.

Embodiment 6

Figure 17:
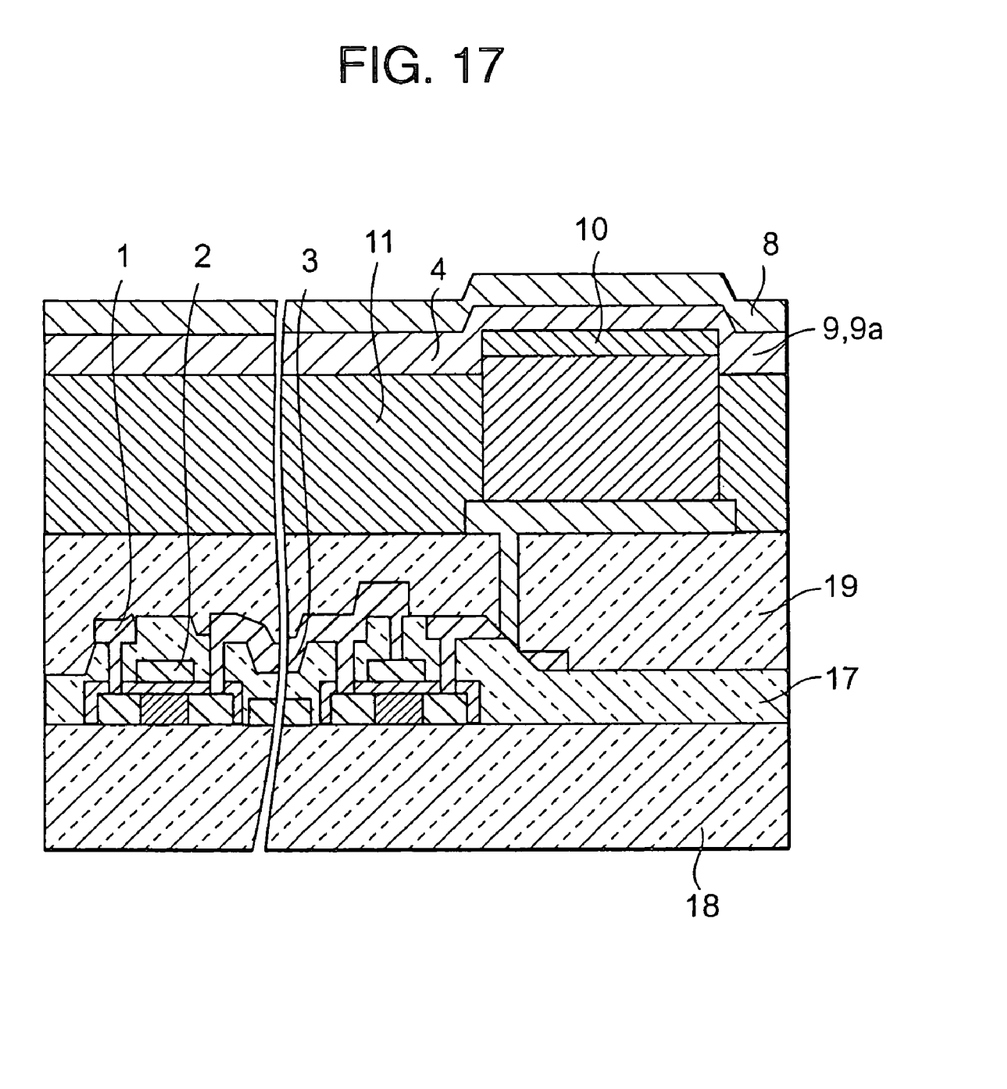
FIG. 17 is a partial cross-sectional diagram of a pixel of the image display in the embodiment 6.

In this embodiment, the image display was produced in the same way as in the embodiment 2. However, as shown in FIG. 17, the lower electrode of the organic EL element formed in the process (1) was formed not as the anode 8 but as the cathode 4. In the process (4), the upper electrode was formed not as the cathode 4 but as the anode 8. In addition, when the charge-transport layer 9 was formed in the process (2), the electron transport layer 9b was produced by using an electron transport substance. When the charge-transport layer was deposited after the formation of the light-emitting layer 10 of process (3), the hole transporting layer 9a was formed by using a hole transporting substance.

Thus, in the image display of this embodiment, the light-emitting region could be made wider than that of the embodiment 2, and the power efficiency could be more increased.

Embodiment 7

Figure 18:
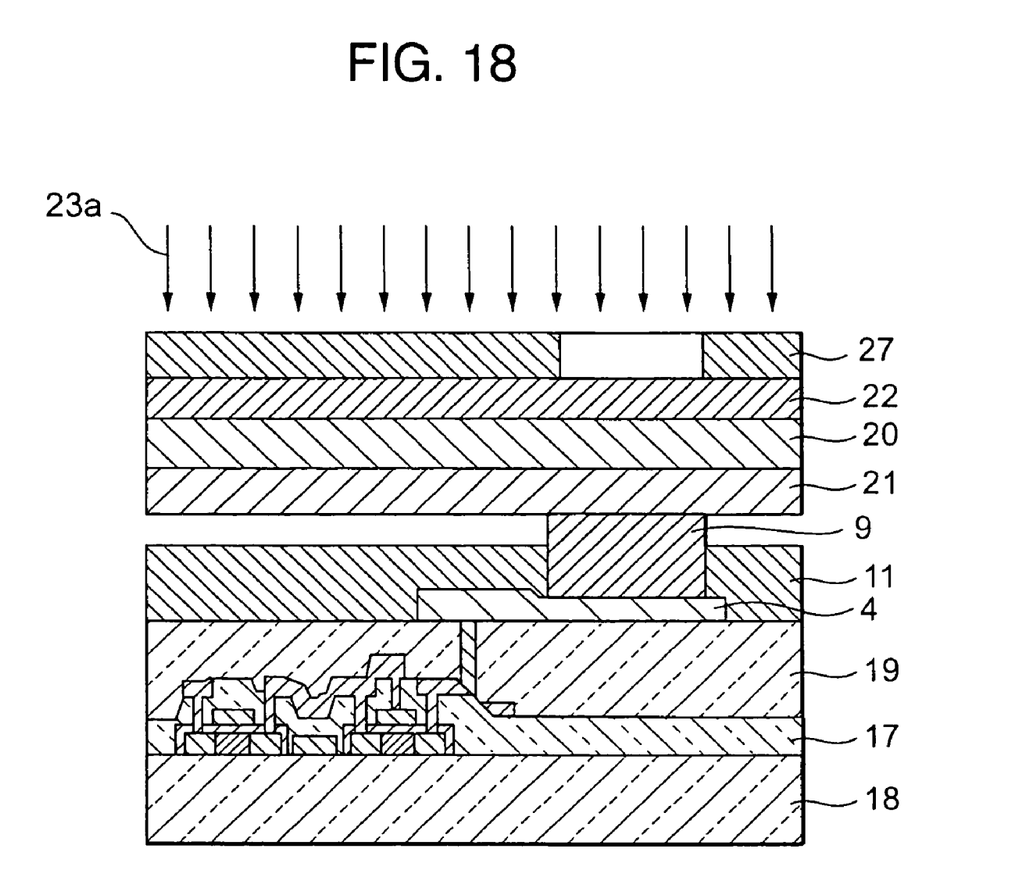
FIG. 18 is a diagram to which reference is made in explaining the transfer process in the embodiment 7.

While the photothermal conversion layer 20 at the locations corresponding to the light-emitting pattern was exposed to the scanning laser beam in the embodiment 1, light 23a was irradiated through a photomask 27 in this embodiment as shown in FIG. 18.

By using the photomask as in this embodiment, it is possible to expose at a time without the scanning light, and therefore the light-emitting layer 10 can be formed by transfer in a short time. In the embodiment 1, a time of about 100 seconds was taken for the substrate having a size of 830 mm×650 mm to be exposed to light. On the other hand, in this embodiment, the substrate of that size could be exposed in a shorter time of 60 seconds.

INDUSTRIAL APPLICABILITY

As described above, this invention can provide a high-resolution and large-area organic EL display panel. In addition, a large-screen and high-resolution image display can be easily produced by using this organic EL display panel.

The invention claimed is:

1. An electroluminescence display panel comprising:
    a substrate
    a first electrode;
    a plurality of light-emitting portions that emit light when a voltage is applied thereto;
    a second electrode;
    an insulating layer; and
    a partition wall for separating the adjacent ones of said light-emitting portions, wherein said first electrode, said llight-emitting portions, said insulating layer, and said second electrode are disposed on said substrate in this order, said light-emitting portions having at least a first charge transport layer and a light-emitting layer disposed in this order on said substrate, and the height of the top of said partition wall being lower than that of said light-emitting layer; wherein
    said light emitting layers being sandwiched with said first charge transport layer and a second charge transport layer in such a manner that one charge transport layer is formed to cover said light-emitting layers and said partition walls.

2. An electroluminescence display panel according to claim 1, wherein said top of said partition wall is water-repellent.

3. An electroluminescence display panel according to claim 1, wherein said top of said partition wall contains fluorine compound.

4. An electroluminescence display panel according to claim 1, wherein said light-emitting layer is a diffusion layer of fluorescent dye formed on the second electrode side of said first charge transport layer.

* * * * *